(12) United States Patent
Takasawa et al.

(10) Patent No.: US 8,400,594 B2
(45) Date of Patent: Mar. 19, 2013

(54) WIRING LAYER, SEMICONDUCTOR DEVICE AND LIQUID CRYSTAL DISPLAY DEVICE

(75) Inventors: Satoru Takasawa, Sammu (JP); Masanori Shirai, Sammu (JP); Satoru Ishibashi, Sammu (JP)

(73) Assignee: Ulvac, Inc., Chigasaki-shi (JP)

( * ) Notice: Subject to any disclaimer, the term of this patent is extended or adjusted under 35 U.S.C. 154(b) by 0 days.

(21) Appl. No.: 13/403,145

(22) Filed: Feb. 23, 2012

(65) Prior Publication Data

US 2012/0194757 A1    Aug. 2, 2012

Related U.S. Application Data

(63) Continuation of application No. PCT/JP2010/063999, filed on Aug. 19, 2010.

(30) Foreign Application Priority Data

Aug. 28, 2009    (JP) .................................. 2009-198815

(51) Int. Cl.
*G02F 1/1335* (2006.01)

(52) U.S. Cl. .......................................... 349/122; 349/43

(58) Field of Classification Search .................. None
See application file for complete search history.

(56) References Cited

U.S. PATENT DOCUMENTS

| 6,037,257 | A | 3/2000 | Chiang |
| 6,066,892 | A | 5/2000 | Ding |
| 6,160,315 | A | 12/2000 | Chiang |
| 2001/0034126 | A1 | 10/2001 | Ding |
| 2005/0018097 | A1* | 1/2005 | Kwon et al. ................... 349/43 |
| 2009/0303406 | A1 | 12/2009 | Takasawa |
| 2011/0281134 | A1 | 11/2011 | Maki |

FOREIGN PATENT DOCUMENTS

| JP | 10-62799 | 3/1998 |
| JP | 11-54458 | 2/1999 |
| JP | 2008-203808 A1 | 9/2008 |
| JP | 2008-311283 A1 | 12/2008 |
| JP | 2010-53445 A1 | 3/2010 |
| WO | WO 2008/081806 A1 | 7/2008 |

OTHER PUBLICATIONS

International Search Report for International Application No. PCT/JP2010/063999 dated Nov. 2, 2010.

* cited by examiner

*Primary Examiner* — Richard Kim
(74) *Attorney, Agent, or Firm* — Kratz, Quintos & Hanson, LLP

(57) ABSTRACT

Provided is an electrode layer and a wiring layer, which are free from peeling from a glass substrate. A wiring layer and a gate electrode layer are constituted by an adhering film which is a thin film made of Cu—Mg—Al formed on a surface of a glass substrate, and a copper film formed on the adhering film. When the adhering film includes Mg in a range of at least 0.5 atom % and at most 5 atom %, and aluminum in a range of at least 5 atom % and at most 15 atom %, assuming that the total number of atoms of copper, magnesium and aluminum is taken as 100 atom %, adhesion of the adhering film to the glass substrate becomes high, and the copper thin film is not peeled from the glass substrate. The wiring layer is electrically connected to a pixel electrode of a liquid crystal display device.

4 Claims, 5 Drawing Sheets

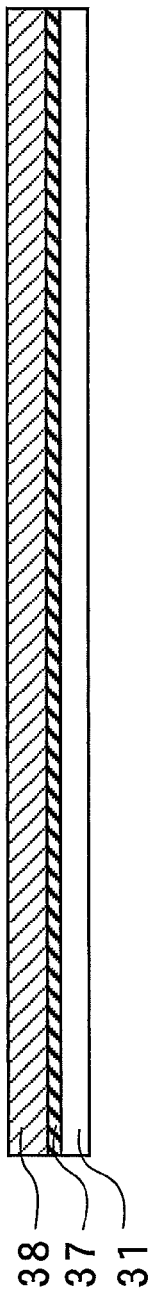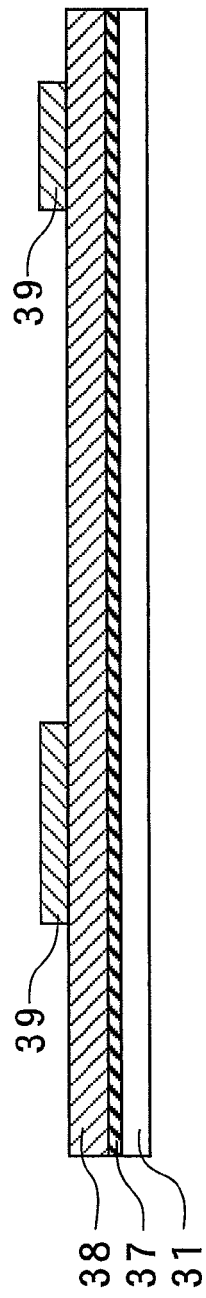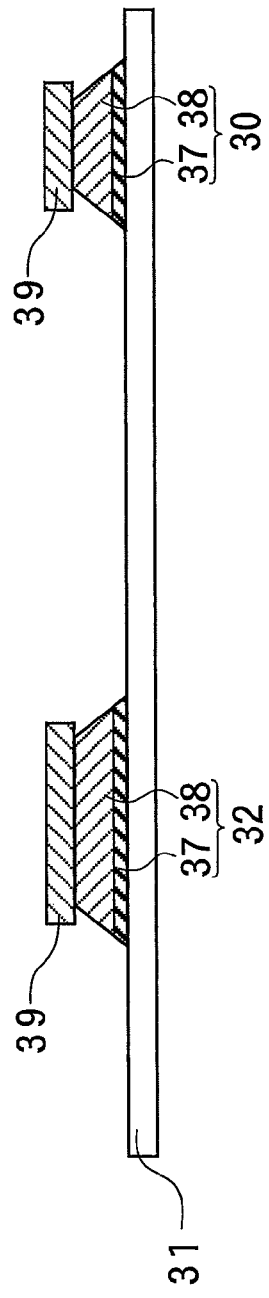

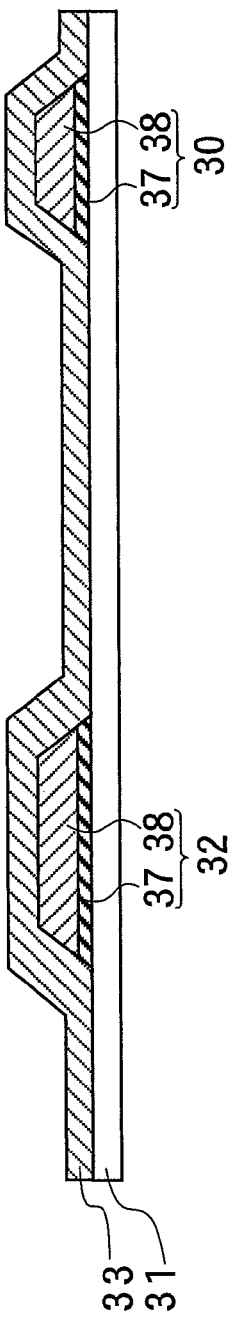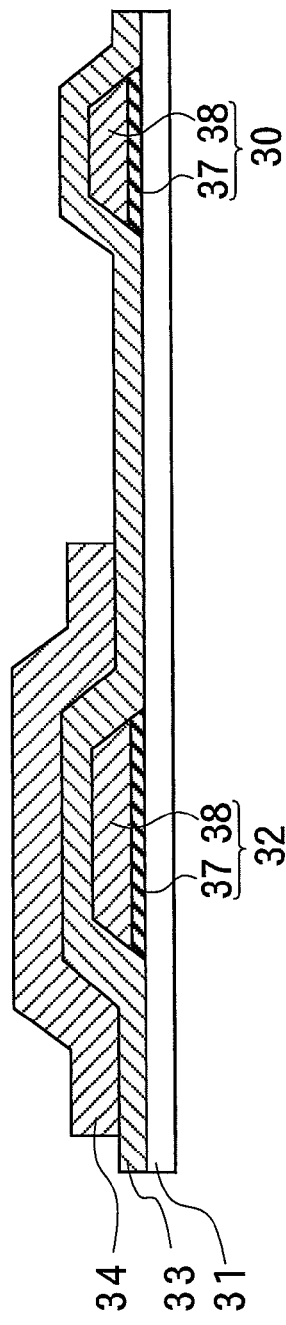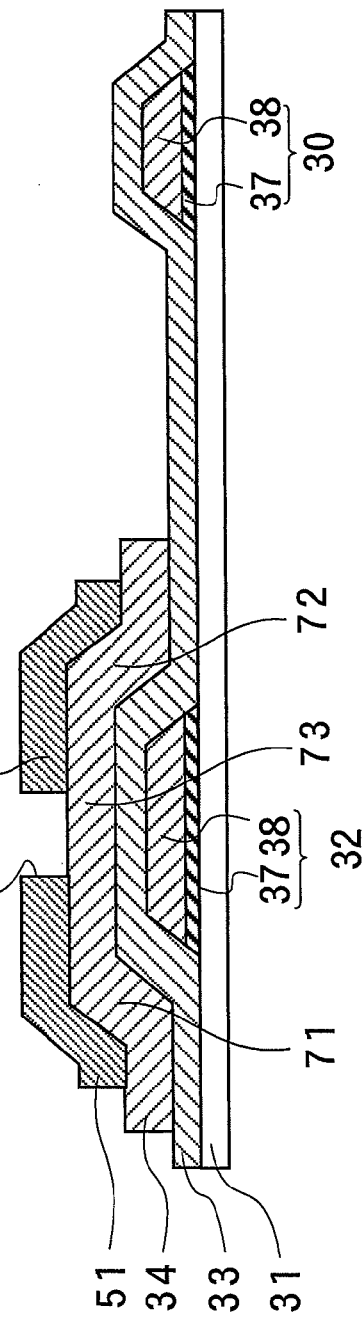

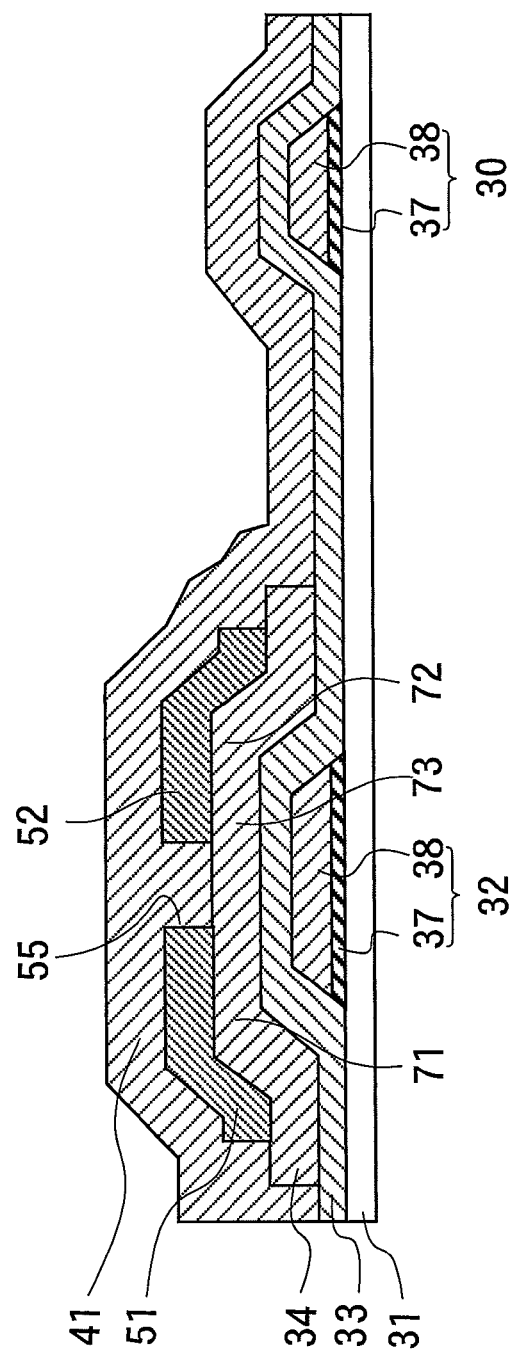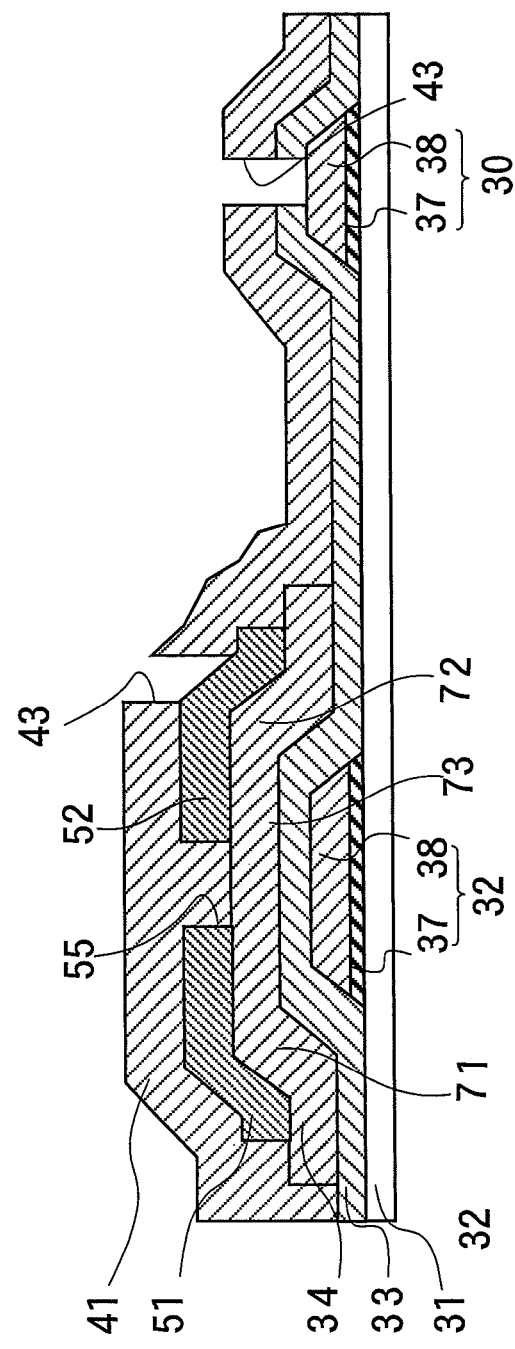
Fig. 4(a)
Fig. 4(b)

WIRING LAYER, SEMICONDUCTOR DEVICE AND LIQUID CRYSTAL DISPLAY DEVICE

This application is a continuation of International Application No. PCT/JP2010/063999, filed on Aug. 19, 2010, which claims priority to Japan Patent Application No. 2009-198815, filed on Aug. 28, 2009. The contents of the prior applications are herein incorporated by reference in their entireties.

BACKGROUND

The present invention generally relates to a technical field of wiring films to be used in minute semiconductor devices; and more particularly, the present invention relates to a technical field of electrode layers and wiring layers to be in contact with glass substrates.

In recently manufactured electric products (such as, FPDs (Flat panel display), thin-film solar cells or the like), transistors are required to be uniformly arranged on a wide substrate, so that amorphous silicon (including hydrogenated amorphous silicon) or the like, which can form semiconductor layer having uniform characteristics on the substrate with large area, are used.

Amorphous silicon can be formed at a low temperature and causes no adverse affect on other materials, but it has a defect in that the mobility is low. Consequently, oxide semiconductors, which can form thin films having high mobility on a large area substrate at low temperatures, have been attracting attention.

Further, in addition to the oxide semiconductors having the high mobility, displaying with uniform brightness has recently been tried by using copper thin films having low resistances in electrode layers and wiring layers of transistors of semiconductor integrated circuits and the FPDs.

However, the copper thin film has poor adhesion to the glass substrate, the oxide semiconductor and the oxide thin film, and copper atoms as a constituting material of the copper thin film diffuse into the semiconductor or the oxide thin film, which may cause reduction in reliability.

More particularly, when a wiring layer and a gate electrode layer are formed on a glass substrate, it is feared that the wiring layer and the gate electrode layer may be peeled, because the copper thin film has poor adhesion to the glass.

In this case, although an adhering film (such as, a TiN film, a W film or the like), which increases adhesion strength of the copper wiring to the glass substrate has been provided between the copper thin film and the glass substrate, there is a problem in that the cost increases. These problems are disclosed in JPA2008-203808 and JPA 2008-311283, for example.

Furthermore, the copper thin film is difficult to be dry etched, and is generally formed by a wet etching method. However, because the copper thin film and the adhering film (such as, the TiN film, the W film or the like) cannot be etched with the same etching liquid, a laminated film having a two-layer structure of the copper thin film and the adhering film cannot be etched in a single etching step.

For this reason, an adhering film having adhesion and being able to be etched with the same etching liquid as for the copper thin film has been sought.

SUMMARY OF THE INVENTION

The present invention has been created so as to solve the problems of the above conventional technique, and its object is to provide a gate electrode layer and a wiring layer having high adhesion ability to the glass substrate.

In order to solve the above problem, the present invention is directed to a wiring layer adapted to be in contact with a glass substrate. The wiring layer includes an adhering film in contact with the glass substrate, and a copper thin film in contact with the adhering film, wherein the adhering film includes copper, magnesium and aluminum; and when the total number of atoms of copper, magnesium and aluminum is taken as 100 atom %, magnesium is set in a range of at least 0.5 atom % to at most 5 atom % and aluminum is set in a range of at least 5 atom % to at most 15 atom %.

The present invention is directed to a semiconductor device including a semiconductor layer, a gate insulating film formed on the semiconductor layer, and a gate electrode opposed to the semiconductor layer via the gate insulating film, a channel region being provided in the semiconductor layer at a portion opposed to the gate electrode, a source region and a drain region being provided on both sides of the channel region, and a source electrode layer and a drain electrode layer being in contact with the source region and the drain region, respectively, wherein the gate electrode layer includes an adhering layer and a copper thin film formed in contact with the adhering film, the adhering layer includes copper, magnesium and aluminum in which when the total number of atoms of copper, magnesium and aluminum is taken as 100 atom %, magnesium is set in a range of at least 0.5 atom % and at most 5 atom % and aluminum is set in a range of at least 5 atom % and at most 15 atom %, and the adhering film is in contact with the glass substrate.

The present invention is directed to a liquid crystal display device including the wiring layer of the present invention and the glass substrate, wherein a pixel electrode, liquid crystals positioned on the pixel electrode, and an upper electrode positioned on the liquid crystals are arranged on the glass substrate, and the pixel electrode is electrically connected to the wiring layer.

The present invention is directed to a liquid crystal display device including the semiconductor device of the present invention and the glass substrate, wherein a pixel electrode, liquid crystals positioned on the pixel electrode and an upper electrode positioned on the liquid crystals are arranged on the glass substrate, and the pixel electrode is electrically connected with one of the drain electrode layer and the source electrode layer.

Because the adhering film and the copper thin film of the present invention can be etched by the same etching liquid, the gate electrode film and the wiring layer of the present invention can be patterned in a single etching step. Since adhesion between the adhering film and the glass substrate is high, the gate electrode layer or the wiring layer formed on the glass substrate will not be peeled.

BRIEF DESCRIPTION OF THE DRAWINGS

FIGS. 2(a) to (c) are first sectional views for illustrating producing steps of one embodiment of the transistor of the present invention and one embodiment of the liquid crystal display device of the present invention, as shown in FIG. 1.

FIGS. 3(a) to (c) are second sectional views for illustrating producing steps of one embodiment of the transistor of the present invention and one embodiment of the liquid crystal display device of the present invention, as shown in FIG. 1.

FIGS. 4(a) and (b) are third sectional views for illustrating producing steps of one embodiment of the transistor of the present invention and one embodiment of the liquid crystal display device of the present invention, as shown in FIG. 1.

DETAILED DESCRIPTION OF THE INVENTION

Figure 1:
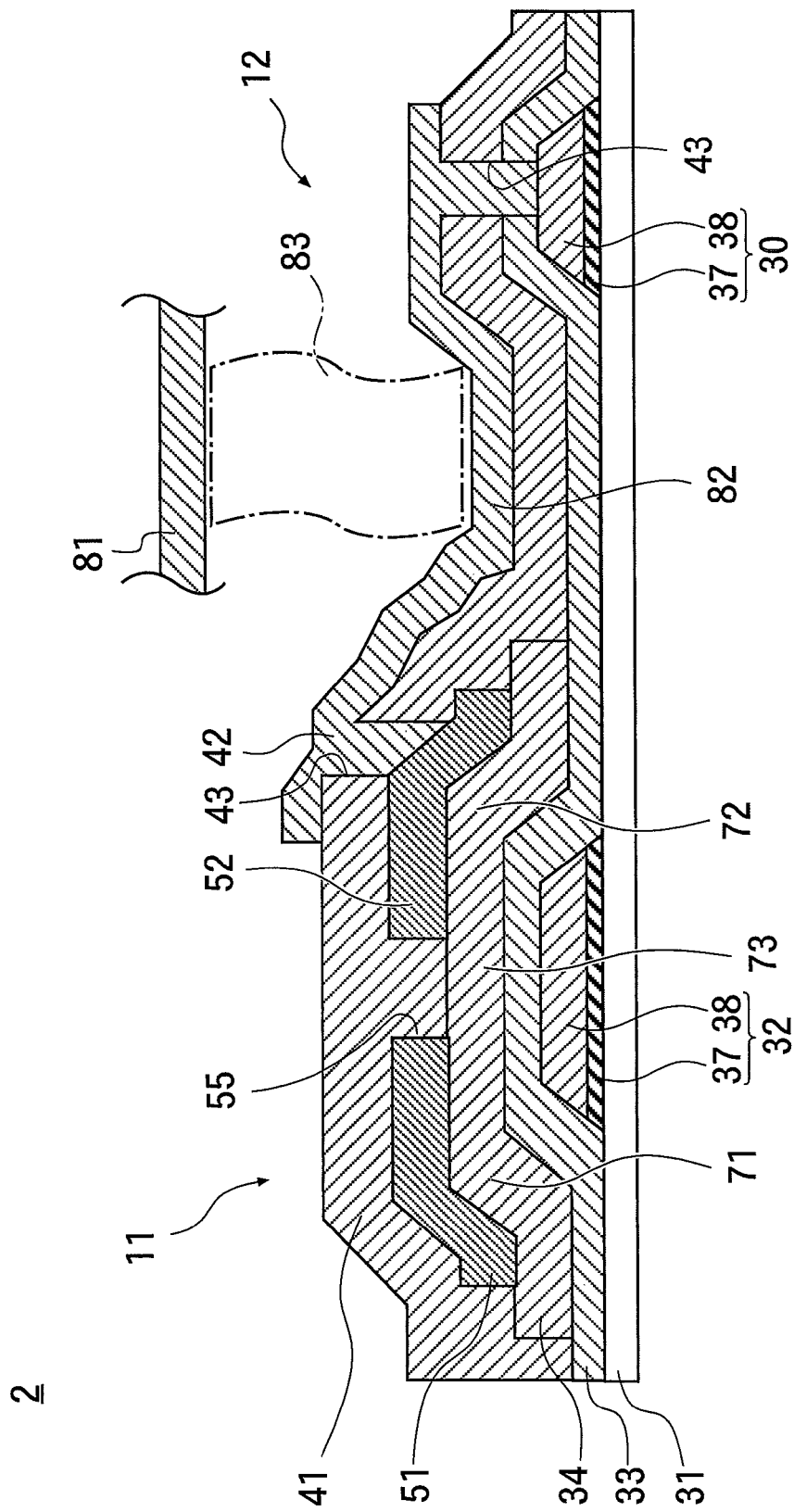
FIG. 1 is a sectional view for illustrating one embodiment of a transistor of the present invention and one embodiment of a liquid crystal display device of the present invention.

In FIG. 1, a reference numeral 2 generally denotes one example of a liquid crystal display device of the present invention, and a sectional view of an example of a transistor 11 of the present invention is shown inside the liquid crystal display device 2 together with a liquid crystal display portion 12.

When the transistor 11 is explained, a slender gate electrode layer 32 is arranged on a surface of a glass substrate 31 in the transistor 11, and a gate insulating film 33 is arranged on the gate electrode layer 32 over at least a width direction.

A semiconductor layer 34 is arranged on the gate insulating film 33, and a source electrode layer 51 and a drain electrode layer 52 are formed on the semiconductor layer 34 at positions above widthwise opposite ends of the gate electrode layer 32 and where they are opposed to end portions of the gate electrode layer 32 via the gate insulating layer 33. A concaved portion 55 is provided between the source electrode layer 51 and the drain electrode layer 52, and the source electrode layer 51 and the drain electrode layer 52 are separated by this concaved portion 55 so that different voltages can be applied.

A protective layer 41 is formed on the source electrode layer 51 and on the drain electrode layer 52, and is also formed on the concaved portion 55 between the source electrode layer 51 and the drain electrode layer 52.

In the transistor 11, when a gate voltage is applied to the gate electrode layer 32 in a state such that a voltage is applied between the source electrode layer 51 and the drain electrode layer 52, a channel region having an electroconductive type opposite to an electroconductive type of the semiconductor layer 34 (or a low resistance region having the same electroconductive type) is formed inside the semiconductor layer 34 at a portion opposed to the gate electrode layer 32 via the gate insulating film 33; then, a portion of the semiconductor layer 34 where the source electrode layer 51 is in contact with and a portion where the drain electrode layer 52 is in contact with are connected at a low resistance by the channel region (or the low resistance region). As a result, the source electrode layer 51 is electrically connected to the drain electrode layer 52, so that the transistor 11 becomes conductive.

When the application of the gate voltage is stopped, the channel region (or the low resistance region) disappears, the resistance between the source electrode layer 51 and the drain electrode layer 52 becomes high, and they are electrically insulated.

A pixel electrode 82 is arranged in the liquid crystal display portion 12; and liquid crystal 83 is arranged on the pixel electrode 82. An upper electrode 81 is positioned on the liquid crystals 83; and when a voltage is applied between the pixel electrode 82 and the upper electrode 81, the polarized nature of light passing through the liquid crystals 83 is changed so that the light transmission of a polarization filter (not shown) is controlled.

The pixel electrode 82 is electrically connected to the source electrode layer 51 or the drain electrode layer 52; and the application of a voltage to the pixel electrode 82 is initiated or terminated when the transistor 11 is turned on or off.

In this embodiment, the pixel electrode 82 is constituted by a part of a transparent electroconductive layer 42 connected to the drain electrode layer 52. The transparent electroconductive layer 42 is made of ITO.

A wiring layer 30 is arranged under the transparent electroconductive layer 42.

This wiring layer 30 and the gate electrode layer 32 are constituted by an adhering film 37 made of Cu—Mg—Al, and a copper thin film 38 made of copper as a major component (a thin film containing copper at a content percentage higher than 50 atom %) formed on the adhering film 37; and the adhering film 37 is in contact with the glass substrate 31, while the copper thin film 38 is not in contact with the glass substrate 31.

Production steps of the transistor 11 will now be explained.

As for this transistor 11, a glass substrate 31 as an object to film-formed is first transferred into a sputtering apparatus.

A Cu—Mg—Al target and a pure copper target are provided inside the sputtering apparatus. As shown in FIG. 2(a), an adhering film 37 is formed on a glass substrate 31 by sputtering the Cu—Mg—Al target with a sputtering gas composed of a rare gas (such as, an Ar gas or the like); and then, a copper thin film 38 is formed on the adhering film 37 by sputtering the pure copper target with a sputtering gas composed of a rare gas. Since no oxygen gas is introduced into the sputtering ambience when the adhering film 37 and the copper thin film 38 are formed, and no copper oxide is included into the adhering film 37 and the copper thin film 38, so that the adhering film 37 and the copper thin film 38 having low resistances are formed.

After the copper thin film 38 is formed, the resultant may be annealed by heating at around 400 degrees Celsius in a desired ambience.

Next, as shown in FIG. 2(b), a patterned resist film 39 is arranged on the copper thin film 38; the glass substrate 31 on which the adhering film 37 and the copper thin film 38 are formed is immersed into an etching liquid capable of etching both pure copper and Cu—Mg—Al; and by bringing the copper thin film 38 exposed between the resist films 39 and the adhering film 37 exposed after etching the copper thin film 38 into contact with the same etching liquid, portions contacting the etching liquid are removed by etching as shown in FIG. 2(c). In this embodiment, the copper thin film 38 and the adhering film 37 are partially removed, and a gate electrode layer 32 and a wiring layer 30 are formed on the glass substrate 31 with remaining portions.

When the gate electrode layer 32 and the wiring layer 30 are formed by patterning, a surface of the glass substrate 31 is exposed other than portions where the gate electrode layer 32 and the wiring layer 30 are positioned. After the resist film 39 is removed, as shown in FIG. 3(a), a gate insulating film 33 made of an insulating material (such as, SiO2, SiNx or the like) is formed on a surface of the glass substrate 31, on a surface of the gate electrode layer 32 and a surface of the wiring layer 30. The gate insulating film 33 is patterned, if necessary.

Then, a thin film made of a semiconductor material (for example, an Si semiconductor or an oxide semiconductor) is formed on the gate insulating film 33; and as shown in FIG. 3(b), a patterned semiconductor layer 34 is formed on the gate insulating film 33 by patterning.

Thereafter, a metallic thin film is formed on at least a surface of the semiconductor layer 34. As shown in FIG. 3(c), a source electrode layer 51 and a drain electrode layer 52 are formed by patterning the metallic thin film. A portion of the semiconductor layer 34, which is in contact with the source electrode layer 51, is called a source region 71; and a portion which is in contact with the drain electrode layer 52, is called a drain region 72. The source electrode layer 51 and the drain electrode layer 52 are arranged on the semiconductor layer 34 above widthwise opposite ends of the gate electrode layer 32, and opposed to the end portions of the gate electrode layer 32 via the gate insulating film 33. Next, as shown in FIG. 4(a), a protective film 41 made of an insulating film (such as, SiNx, SiO2 or the like) is formed.

Figure 5:
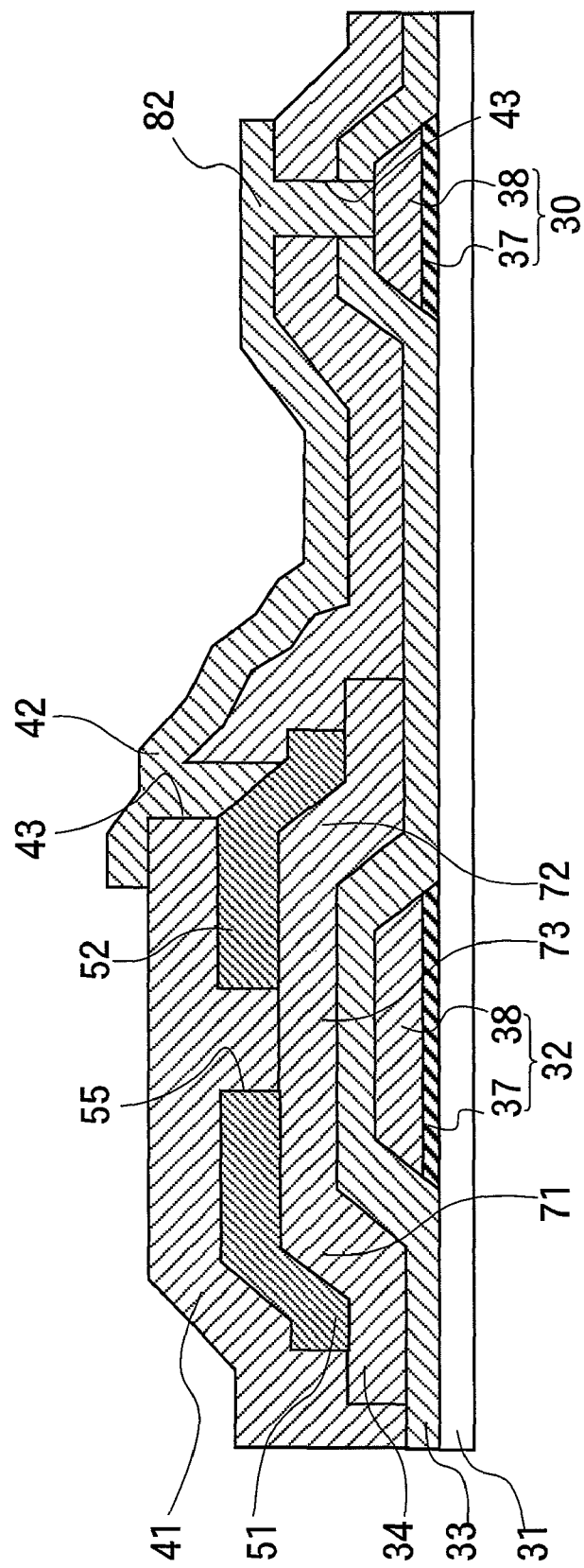
FIG. 5 is a fourth sectional view for illustrating the producing steps of one embodiment of the transistor of the present invention and one embodiment of the liquid crystal display device of the present invention, as shown in FIG. 1.

Then, as shown in FIG. 4(b), connection holes 43 (such as, via holes, contact holes or the like) are formed in the protective film 41 or the gate insulating film 33; and surfaces of the drain electrode layer 52, the source electrode layer 51, the copper thin film 38 possessed by the wiring layer 30 or the like are exposed at bottom faces of the connection holes 43. In this state, a transparent electroconductive layer is formed and patterned. In FIG. 5, reference numeral 42 denotes the patterned transparent electroconductive film.

Further, when a liquid crystal display device 2 shown in FIG. 1 is obtained by disposing liquid crystals 83 and an upper electrode 81 in a subsequent step, a transistor 11 is set in an operable condition.

A channel region 73 is a region of the semiconductor layer 34 between a source region 71 and a drain region 72, and the gate electrode layer 32 is located in a position at least opposed to the channel region 73 via the gate insulating film 33. The transistor 11 is constituted in this manner by the gate insulating film 33, and the gate, source, drain electrode layers 32, 51, 52.

Meanwhile, the semiconductor layer 34 includes various semiconductors, an oxide semiconductor (such as, InGaZnO or the like), an amorphous semiconductor made of Si, a polycrystal semiconductor, a single crystal semiconductor or the like.

Furthermore, in the above embodiment, a laminated film of the adhering film 37 and the copper thin film 38 is used for the wiring layer 30 and the electrode layer 32, but when a source electrode layer and a drain electrode layer of a MOS transistor are in contact with a glass substrate, the source electrode layer and the drain electrode layer can be constructed by the laminated layer of an adhering film 37 and a copper thin film 38.

EXAMPLES

A target is produced from Cu (copper) as a major component into which Mg (magnesium) and Al (aluminum) are included at a desired ratio; an adhering film having the same composition of Cu—Mg—Al as in the target is formed on glass substrate by sputtering the target; then, a pure copper thin film is formed on the adhering film by sputtering a target of pure copper; and thereby, a laminated film to be used as a gate electrode layer and a wiring layer is formed.

Adhering films are formed by changing the addition ratio of Mg and Al; then, pure copper thin films are formed; and thereafter, the adhesion between the glass substrate and the electrode and wiring layers is evaluated. Evaluation results are listed in the following Table 1.

After the adhering film and the pure copper thin film are formed, measurements are carried out for both when annealing is performed in a vacuum atmosphere at 400° C. for 1 hour and when no annealing is performed.

TABLE 1

| | | | | Adhesion property (Tape test) | |
|---|---|---|---|---|---|
| Composition of adhering layer | Mg content X atom % | Al content Y atom % | Whether target can be produced or not | No annealing | After annealing |
| Cu | — | — | ○ | X | X |
| Cu—X atom % Mg | 0.5 | — | ○ | X | X |
| | 2.5 | — | ○ | X | X |
| | 5 | — | X | — | — |
| Cu—Y atom % Al | — | 5 | ○ | X | X |
| | — | 10 | ○ | ○ | X |
| | — | 15 | ○ | ○ | ○ |
| | — | 20 | X | — | — |
| Cu—X atom % Mg—Y atom % Al | 0.5 | 3 | ○ | X | X |
| | | 5 | ○ | ○ | ○ |
| | | 10 | ○ | ○ | ○ |
| | | 15 | ○ | ○ | ○ |
| | | 20 | X | — | — |
| | 2.5 | 3 | ○ | ○ | X |
| | | 5 | ○ | ○ | ○ |
| | | 10 | ○ | ○ | ○ |
| | | 15 | ○ | ○ | ○ |
| | | 20 | X | — | — |
| | 5 | 3 | X | — | — |
| | | 5 | ○ | ○ | ○ |
| | | 10 | ○ | ○ | ○ |
| | | 15 | ○ | ○ | ○ |
| | | 20 | X | — | — |
| | 10 | 3 | X | — | — |
| | | 5 | X | — | — |
| | | 10 | X | — | — |
| | | 15 | X | — | — |
| | | 20 | X | — | — |

"After anealing" means measuring results after heating in a vacuum ambience at 400 degrees Celsius for 1 hour.

Figures in columns of "Mg content" and "Al content" in Table 1 show the rate (X atom %) of the number of contained Mg atoms, and the rate (Y atom %) of the number of contained Al atoms when the total number of the number of Cu atoms, the number of Mg atoms and the number of Al atoms in the target or the adhering film is taken as 100 atom %. Meanwhile, "–" means that the content is zero.

In a column labeled "Whether a target can be produced or not", a case where a material of Cu, Mg and Al was molded in the form of a target is classified into "○", whereas a case where no target could be formed is classified into "X".

As to evaluations in a column labeled "Adhesion", a case where an adhesive tape was pasted on a surface of a pure copper thin film, the adhesive tape is peeled off, and a case in which the adhesive tape is peeled from an interface between the adhesive tape and the pure copper thin film is classified into "○", whereas a case in which destruction inside the electrode layer or peeling from an interface between the electrode layer and the glass substrate has occurred is classified into "X".

It is seen from results on "Adhesion" in Table 1 that adhesion and barrier properties after the annealing are poor in the case where both Mg and Al are not contained; whereas, adhesion to the glass substrate is excellent in the case where the Mg content is at least 0.5 atom % and at most 5 atom % and the Al content is at least 5 atom % and at most 15 atom %.

Therefore, the adhering films 37, which is a thin film made of Cu—Mg—Al in each of the Examples according to the present invention, are desirably electroconductive films such that when the total number of the number of Cu atoms, the number of Mg atoms and the number of Al atoms is taken as 100 atom %, the Mg content is at least 0.5 atom % and at most 5 atom % and the Al content is at least 5 atom % and at most 15 atom %.

The copper thin film 38 which is formed on the adhering film 37 and in contact with the adhering film 37, is an electroconductive film having a low resistance such that when the number of the atoms of the copper thin film 38 is taken as 100 atom %, copper is contained at a content percentage of over 50 atom %.

What is claimed is:

1. A wiring layer being in contact with a glass substrate, the wiring layer comprising:
   an adhering film being in contact with the glass substrate; and
   a copper thin film being in contact with the adhering film, the adhering film includes copper, magnesium and aluminum, and when the total number of atoms of copper, magnesium and aluminum is taken as 100 atom %, magnesium is set in a range of at least 0.5 atom % and at most 5 atom %, and aluminum is set in a range of at least 5atom % and at most 15 atom %.

2. A semiconductor device, comprising:
   a gate electrode layer formed on a glass substrate;
   a gate insulating film formed on the gate electrode layer;
      a semiconductor layer formed on the gate insulating film;
      a channel region being provided in the semiconductor layer at a portion opposed to the gate electrode layer, a source region and a drain region being provided on both sides of the channel region, and
      a source electrode layer and a drain electrode layer being in contact with the source region and the drain region, respectively,
   wherein the gate electrode layer includes an adhering film and a copper thin film formed in contact with the adhering film, the adhering film includes copper, magnesium and aluminum in which when the total number of atoms of copper, magnesium and aluminum is taken as 100 atom %, magnesium is set in a range of at least 0.5 atom % and at most 5 atom %, and aluminum is set in a range of at least 5 atom % and at most 15 atom %, and the adhering film is in contact with the glass substrate.

3. A liquid crystal display device comprising:
   the wiring layer of claim 1 and the glass substrate, wherein a pixel electrode, liquid crystals positioned on the pixel electrode and an upper electrode positioned on the liquid crystals are arranged on the glass substrate, and
   wherein the pixel electrode is electrically connected to the wiring layer.

4. A liquid crystal display device comprising: the semiconductor device of claim 2 and a glass substrate,
   wherein a pixel electrode, liquid crystals arranged on the pixel electrode and an upper electrode arranged on the liquid crystals are disposed on the glass substrate, and
   wherein the pixel electrode is electrically connected with one of the drain electrode layer and the source electrode layer.

* * * * *